(12) United States Patent
Sanchez et al.

(10) Patent No.: US 9,646,897 B2
(45) Date of Patent: May 9, 2017

(54) DIE CRACK DETECTOR WITH INTEGRATED ONE-TIME PROGRAMMABLE ELEMENT

(71) Applicant: Freescale Semiconductor, Inc., Austin, TX (US)

(72) Inventors: Audel A. Sanchez, Tempe, AZ (US); Michele L. Miera, Gilbert, AZ (US); Robert A. Pryor, Mesa, AZ (US); Jose L. Suarez, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/064,428

(22) Filed: Oct. 28, 2013

(65) Prior Publication Data

US 2015/0115266 A1 Apr. 30, 2015

(51) Int. Cl.
*H01L 21/66* (2006.01)
*H01L 23/58* (2006.01)
*H01L 23/525* (2006.01)

(52) U.S. Cl.
CPC ............. *H01L 22/20* (2013.01); *H01L 22/34* (2013.01); *H01L 23/585* (2013.01); *H01L 22/14* (2013.01); *H01L 23/5256* (2013.01); *H01L 2924/0002* (2013.01); *H01L 2924/3512* (2013.01)

(58) Field of Classification Search
CPC .......... H01L 2924/0002; H01L 2924/00; H01L 22/34; H01L 23/585; H01L 22/14; H01L 23/562; H01L 2924/3011; G01R 31/2884; G01R 31/2853; G01R 31/2831

USPC .............. 257/48, 620, E21.151, 107, 414; 324/522, 719, 762.05; 438/140
See application file for complete search history.

(56) References Cited

U.S. PATENT DOCUMENTS

| | | | |
|---|---|---|---|
| 5,153,507 A | 10/1992 | Fong et al. | |
| 6,649,986 B1 | 11/2003 | Ishizaki et al. | |
| 7,247,921 B2 * | 7/2007 | Sugiura et al. | 257/494 |
| 7,256,475 B2 | 8/2007 | Jao et al. | |
| 7,575,958 B2 | 8/2009 | Hoefler et al. | |
| 7,649,200 B1 | 1/2010 | Miller et al. | |
| 7,683,627 B2 | 3/2010 | Tsukuda | |
| 7,791,070 B2 | 9/2010 | Huang et al. | |
| 7,791,970 B2 | 9/2010 | Roy et al. | |
| 7,973,547 B2 | 7/2011 | Nitsch et al. | |
| 8,575,723 B2 | 11/2013 | Tschmelitsch et al. | |
| 2008/0035923 A1 * | 2/2008 | Tschmelitsch et al. | 257/48 |
| 2009/0009186 A1 * | 1/2009 | Kaneko | 324/550 |
| 2010/0025824 A1 * | 2/2010 | Chen et al. | 257/620 |

(Continued)

*Primary Examiner* — David Vu
*Assistant Examiner* — Jonathan Han (57) ABSTRACT

The embodiments described herein provide a die crack detector and method that use a conductive trace arranged to at least substantially extend around a perimeter of an integrated circuit die. A one-time programmable element, such as a fuse, is coupled in series with the conductive trace, and a package lead is electrically coupled to both the fuse and another operational element on the integrated circuit die. With the fuse intact the package lead can thus be used to determine a measurement of the conductivity of the conductive trace, with the measurement of conductivity indicative of the presence of a crack on the die. After such testing the fuse can be electrically opened, and the package lead used for normal operation of the device on the packaged die without the conductive trace interfering with this operation.

17 Claims, 4 Drawing Sheets

(56) References Cited

U.S. PATENT DOCUMENTS

2010/0039128 A1 2/2010 Nitsch et al.
2010/0327400 A1* 12/2010 Choi et al. .................... 257/529

* cited by examiner

DIE CRACK DETECTOR WITH INTEGRATED ONE-TIME PROGRAMMABLE ELEMENT

TECHNICAL FIELD

Embodiments of the subject matter described herein relate generally to semiconductor device fabrication and more specifically to detecting cracks in semiconductor substrates.

BACKGROUND

Integrated circuits (ICs) are typically formed on a semiconductor wafer that is subsequently cut into individual dies. The dies are then typically encased in a package, with various elements on the die connected to corresponding leads on the package. In modern ICs each die can include numerous individual devices, including transistors, diodes, capacitors, inductors, and resistors. Additionally, each die can include the various connections between such devices, including multiple levels of wiring and various types of vertical interconnects.

One issue with such ICs is the formation of cracks on the die. Cracks can form on dies with a variety of structures, including fissures, fractures and/or other dislocations. The cracking of dies during fabrication, cutting and/or packaging can result in various types of IC failures. For example, die cracks can lead to runaway current leakage that may render the IC inoperable. Such failures are particularly problematic on modern ICs with relatively high densities and relatively high heat generation. Furthermore as dies become smaller and thinner they can become more susceptible to cracking the potential resulting failures.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Integrated circuits (ICs) are typically formed on a semiconductor wafer, such as silicon, gallium nitride or gallium arsenide wafers. The formation of these ICs typically includes a variety of processes, including imaging, deposition, etching, and doping. In modern ICs each die can include numerous individual devices, including transistors, diodes, capacitors, inductors, and resistors. Additionally, each die can include the various connections between such devices, including multiple levels of wiring and various types of vertical interconnects. After fabrication of the IC the wafer is subsequently cut into individual pieces called "dies". The dies are then connected into packages that are typically formed of ceramic or plastic. Each die is connected to into its corresponding package using bond wires that connect various elements on the IC to leads on the package, where the leads thus provide the external connections to the packaged IC. In modern ICs these leads can be in a variety of forms, including gull-wing leads, j-leads, pin grid arrays, ball grid arrays, and land grid arrays.

One issue in the fabrication and packaging of ICs is the presence of cracks on the die. Cracks can form on dies with a variety of structures, including fissures, fractures and/or other dislocation. Furthermore relatively small cracks can enlarge during subsequent processing or use. For example, cracks can form or enlarge during fabrication, cutting, packing, and or installation into the end devices. In any cases such cracks can lead to failure of one or more devices on the IC. For example, die cracks can lead to current leakage in the die that may interfere with the operation of passive and/or active components on the IC.

Die cracks can be particularly problematic on modern ICs with relatively high densities and relatively high heat generation. Furthermore as dies become smaller and thinner they can become more susceptible to cracking the potential resulting failures. Furthermore, because die cracks can enlarge during subsequent activities it is important to detect cracks that are too currently small to effect operation now but may enlarge in the future. For example, die cracks that are relatively small after packaging can enlarge when heated and installed into the end device by the customer. Thus, it is important to detect such relatively small cracks even if those cracks are not currently causing failures. Specifically, it is important to detect such relatively small cracks before the packaged IC is shipped to a customer and/or installed on the end use device.

Furthermore, there is a growing need for the ability to detect cracks on dies that comprise relatively low conductivity substrates. For example, on dies of gallium arsenide or silicon over insulator where a relatively small crack may need to reach an active region before it would impact the operation of the IC device. Again, such a small crack may not initially generate a failure but may enlarge in the future to cause such a failure. Detecting such small cracks on low conductivity substrates before failure can thus improve reliability and performance of such devices.

For these reasons there is a need to test dies for cracks before such dies are shipped to customers. However, some techniques used to test packaged ICs for cracks require the permanent dedication of one or more leads to such testing. In such a technique the dedicated leads are coupled to test equipment during testing. However, such dedicated leads may only be used for die crack testing and after testing these dedicated leads cannot be used to perform other useful functions. This requirement of a dedicated lead for testing is problematic for ICs that use packaging with a limited number of leads available. For this reason such techniques have not been appropriate for die crack testing in all such devices, and such techniques will continue to be problematic for future IC devices.

In accordance with the embodiments described herein, a die crack detector and method are provided. In general, the die crack detector and method use a conductive trace that is arranged to at least substantially extend around a perimeter of an integrated circuit die. A one-time programmable element is coupled in series with the conductive trace, and a package lead is electrically coupled to both the one-time programmable element and another operational element on the integrated circuit die. The conductive trace, fuse and package lead are arranged such that the package lead is electrically coupled to the conductive trace when the one-time programmable element is intact. With the one-time programmable element intact the package lead can thus be used to determine a measurement of the conductivity of the conductive trace, with the measurement of conductivity indicative of the presence of a crack on the die. After such testing the one-time programmable element can be electrically opened.

In one embodiment the one-time programmable element comprises a fuse. In such an embodiment the fuse can be opened by applying a voltage and/or current above a specified threshold. In another embodiment the one-time programmable element comprises a circuit configured to electrically decouple when activated. For example, the one-time programmable element can comprise a one-time selectable switch.

After the one-time programmable element has been opened the package lead is no longer coupled to the conductive trace, but remains coupled to the other operational element on the packaged die. For this reason the package lead can then be used for normal operation of the device on the packaged die without the conductive trace interfering with this operation. Furthermore, it should be noted that because the same package lead is used in die crack detection and the later normal operation of the device that the need for a separate, dedicated lead for die crack detection on the package can be avoided.

Figure 1:
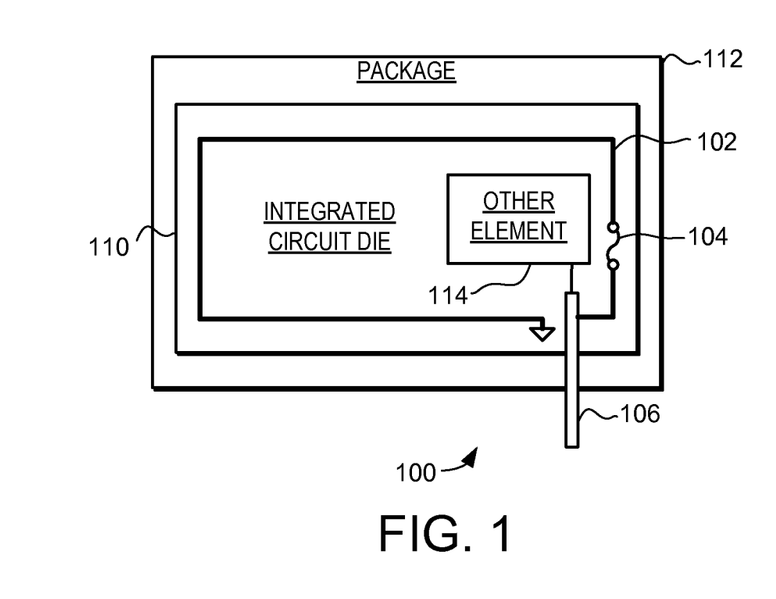
FIG. 1 is a schematic diagram of a die crack detector in accordance with an example embodiment.

Turning now to FIG. 1, a schematic view of a die crack detector 100 is illustrated. In this illustrated embodiment the one-time programmable element comprises a fuse. The die crack detector 100 thus includes a conductive trace 102, a fuse 104, and a package lead 106. The conductive trace 102 is arranged to at least substantially extend around a perimeter of an integrated circuit die 110. When so arranged the conductive trace 102 can be used to detect the presence of cracks on the die 110. The fuse 104 is formed on the die 110 and is coupled in series with the conductive trace 102. The integrated circuit die 110 is placed in a package 112, with the package lead 106 electrically coupled to both the fuse 104 and another operational element 114 on the die 110.

The conductive trace 102, fuse 104 and package lead 106 are arranged such that the package lead 106 is electrically coupled to the conductive trace 102 when the fuse 104 is intact. With the fuse 104 intact the package lead 106 can thus be used to determine a measurement of the conductivity of the conductive trace 102, with the measurement of conductivity indicative of the presence of a crack on the die 110. Specifically, if the conductive trace 102 is conductively intact then this is indicative of no significant cracks across the conductive trace 102. Thus, by measuring the conductivity of the conductive trace 102 it can be determined if such cracks occur anywhere along the length of the conductive trace 102.

After the conductive trace 102 has been used for die crack testing the fuse 104 can be electrically opened. As one example, applying a sufficient voltage and/or current to the package lead 106 can electrically open the fuse 104. Opening the fuse 104 disconnects the package lead 106 from the conductive trace 102. Thus, opening the fuse 104 results in the package lead 106 being electrically uncoupled from conductive trace 102 while remaining electrically coupled to the operational element 114 on the die 110. For this reason the package lead 106 can then be used for normal operation of the operational element 114. Specifically, the package lead 106 can be used for normal operation without the conductive trace 102 interfering with this operation. This is particularly important in applications where high speed devices are used. For example, in radio frequency (RF) applications where the conductive trace 102 could create unwanted parasitic effects if left electrically coupled to the package lead 106 after testing was complete.

This arrangement thus facilitates both die crack testing and normal operation of the devices on die 110. Furthermore, this arrangement facilitates die crack testing without requiring separate, dedicated leads for such die testing. Specifically, because the same package lead 106 is used in die crack detection and the later normal operation of the device there is no need for an additional, separate, dedicated lead for die crack detection on the package 112.

It should also be noted that while the device illustrated in FIG. 1 shows only one lead 106 and one operational element 114 on the die 110 that this is a merely a simplified example. In a typical implementation the package 112 would include a large number of leads coupled to a corresponding large number of operational elements on the die 110.

The conductive trace 102 can be formed in a variety of arrangements and with a variety of different materials. As a first example, the conductive trace 102 can be configured with a first end coupled to the fuse 104 and a second end coupled to a fixed potential such as ground or a common package connection. This arrangement facilitates measuring the conductivity of the conductive trace 102 over its length to determine if cracks are present in the die 110. Specifically, with the second end of the conductive trace 102 coupled to ground a measurement of the conductivity between the package lead 106 and another lead also coupled to ground can be used to determine if the conductive trace 102 is intact over its length, or if conversely, cracks in the die 110 have broken continuity or otherwise reduced the conductivity of the conductive trace 102.

In this embodiment the second end of the conductive trace 102 can be coupled to ground with any suitable connection. For example, a vertical interconnect can be used to electrically couple the second end of the conductive trace 102 to the die 110 substrate, where the die 110 substrate is grounded or otherwise set to fixed potential.

The conductive trace 102 can be formed with a variety of different fabrication procedures. For example, the conductive trace 102 can be formed with any of the various layers of conductive material used to connect the devices on die 110. As specific examples, the conductive trace 102 can be formed in the same process steps used to form and/or connect transistor gates (e.g., gate layer) or other such elements on the die. As other examples the conductive trace 102 can be formed of the same process used to form any of the various horizontal wiring layers (i.e., wiring layer M0, M1, M2, etc.). As other examples, any available metal film can also be used.

Furthermore, the conductive trace 102 can be formed with a variety of different conductive materials. For example, the conductive trace 102 can be formed with appropriately doped regions of semiconductor (e.g., polysilicon) or various metals (e.g., copper, aluminum, tungsten). As other examples, the conductive trace 102 can be formed with gate metal.

As described above, the conductive trace 102 is arranged to at least substantially extend around a perimeter of an integrated circuit die 110. In general the greater portion of the perimeter that the conductive trace 102 extends around the greater the detection ability provided by the conductive trace 102. For this reason it is generally desirable to have conductive trace 102 extend around at least about 80% of the perimeter, although in other embodiments the percentage of perimeter followed by the conductive trace 102 may be less.

In one specific embodiment the conductive trace 102 is formed proximate a die seal ring structure on the die 110. For example, the conductive trace 102 can be formed to follow either closely outside or closely inside the die seal ring structure. As another example, the conductive trace 102 can be formed to have a meandering path. In general, die seal ring structures are formed to prevent die sawing stresses from affecting the elements in the interior of the die 110. For this reason die seal ring structures are typically formed to extend around the perimeter of the die 110. Forming the conductive trace 102 proximate to and on either side of the seal ring structure thus provides the ability to detect cracks near the edge of the die.

The fuse 104 can be implemented with any suitable type of fuse that can be integrated on the die 110. In general, the fuse 104 is implemented to be electrically opened. When fabricated such a fuse 104 provides an electrical connection between the package lead 106 and the conductive trace 102. The fuse 104 can then be put into a high impedance state (i.e., opened) by the application of current and/or voltage above a specified threshold. This opening of the fuse serves to sever the ohmic connection between electrodes in the fuse, creating an open circuit and electrically uncoupling the package lead 106 from the conductive trace 102.

Such fuses can be implemented with a variety of structures and can be fabricated on the die 110 using a variety of processes. In general it is desirable to use a fuse 104 that can be fabricated with processes compatible with the processes used to form the other elements on the die 110, including the conductive trace 102 and the element 114.

The die crack detector 100 can be used in a variety of different types of devices. For example, the die crack detector 100 can be used to detect cracks in various different types of dies cut from any of the various different types of semiconductor substrates. For example, the die 110 can comprise dies of bulk semiconductor, including silicon or gallium arsenide. Additionally, the die 110 can comprise dies of silicon-on-insulator (SOI), silicon-on-sapphire (SOS) or silicon germanium-on-insulator (SGOI).

The die crack detector 100 can also be used with dies that include a variety of different types of integrated circuits. For example, the die crack detector can be used with analog, digital, and mixed signal devices. As more detailed examples, the die crack detector 100 can be used with dies that contain RF devices, including integrated passive devices such as integrated capacitors, inductors, and resistors. In such applications the ability to electrically uncouple the conductive trace 102 from the package lead 106 can reduce the probability of unwanted parasitic effects that could otherwise occur in such integrated passive devices. As more detailed examples, the die crack detector can be used with traditional digital devices such as CMOS.

Figure 2A:
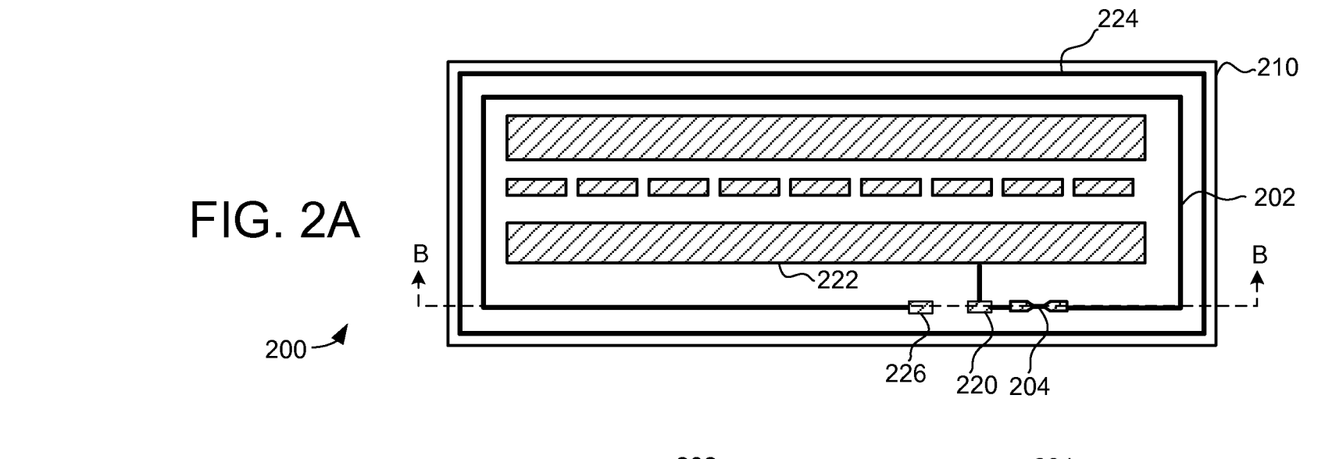
FIGS. 2A and 2B are top and cross sectional side views of a die crack detector in accordance with another example embodiment.
Figure 2B:
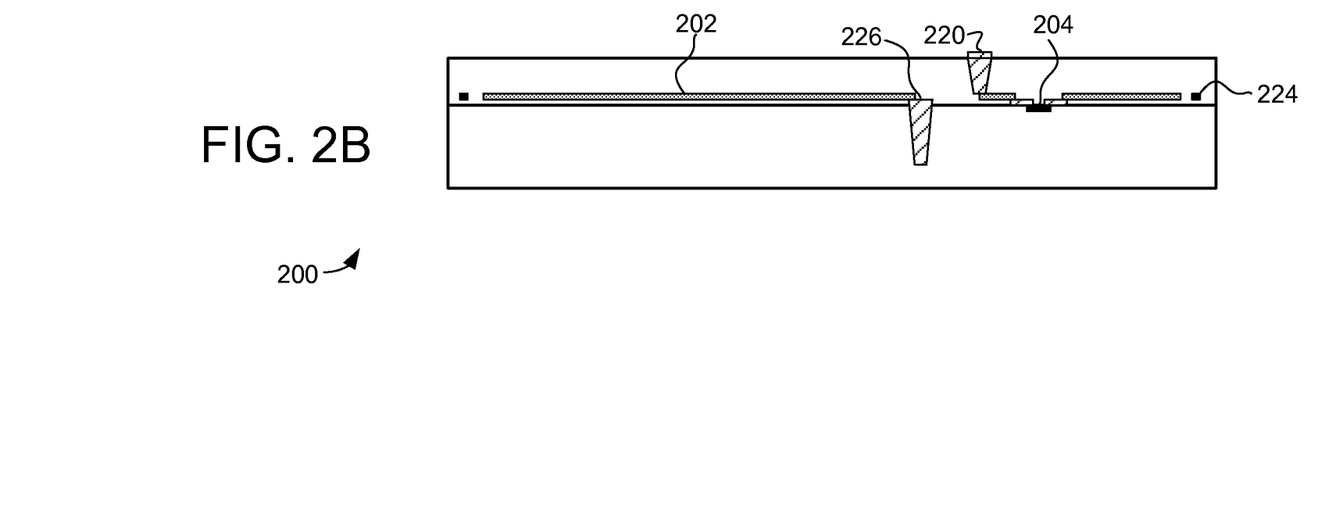

Turning now to FIGS. 2A and 2B, top and side views of a die crack detector 200 are illustrated, with FIG. 2B taken along line B-B. In general, the die crack detector 200 includes a conductive trace 202 and a fuse 204. The conductive trace 202 is arranged to at least substantially extend around a perimeter of an integrated circuit die 210. The fuse 204 is formed on the die 210 and is coupled to a first end of the conductive trace 202. A second end of the conductive trace 202 is coupled to a vertical interconnect 226. The vertical interconnect electrically couples the second end of the conductive trace 202 to the underlying substrate to ground the conductive trace 202. The conductive trace 202 is coupled to a pad 220. The pad 220 is also electrically connected to an operational element, in this case the electrode of an integrated capacitor 222. Of course, the integrated capacitor 222 is just one example of the type of devices that can be connected to the same lead.

Not shown in FIG. 2 is the package in which the die 210 is secured, or the plurality of package leads that provide connection to the elements on the die. When installed in such a package one of these package leads will be electrically coupled (e.g., with wire bonding) to the pad 220. This package lead is thus electrically coupled to the conductive trace 202 when the fuse 204 is intact. With the fuse 204 intact this package lead can thus be used to determine a measurement of the conductivity of the conductive trace 202, with the measurement of conductivity indicative of the presence cracks on the die 210.

After the conductive trace 202 has been used for die crack testing the fuse 204 can be electrically opened by appropriate application of current and/or voltage. This opening of the fuse 204 disconnects the package lead from the conductive trace 202, while the package lead remains electrically coupled to the integrated capacitor 222. It should be noted that the fuse 204 is implemented such that the opening of the fuse 204 does not harm the integrated capacitor 222. For example, by implementing a fuse 204 that can be opened with relatively low current and/or voltage. For this reason the package lead can then be used for normal operation of the integrated capacitor 222 without the conductive trace 202 interfering with this operation. This is particularly important in high speed applications where such integrated passive devices are used. For example, in RF applications the frequency response of the integrated capacitor 222 could be impacted by unwanted parasitic effects if left electrically coupled to the conductive trace after testing.

The die 210 also includes a die seal ring structure 224. The die seal ring structure 224 is formed around the perimeter of the die 210 to prevent die sawing stresses from affecting the integrated capacitor 222 and other such elements in the interior of the die 210. A variety of structures and techniques can be used to form such die seal ring structures 224. In the illustrated embodiment the conductive trace 202 is formed inside die seal ring structure 224 thus provides the ability to detect cracks that extend into the interior inside the die seal ring structure 224. As one specific example, the conductive trace 202 can comprise a 5 µm wide metal conductor placed 10 µm inside the die seal ring structure 224. Again, this is just one example, and in other embodiments other arrangements of the conductive trace 202 and the die seal ring structure 224 could instead be used.

Figure 3:
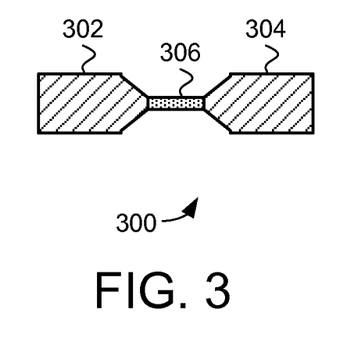
FIG. 3 is a schematic diagram of a fuse in accordance with an example embodiment.

Turning now to FIG. 3, a schematic view of an exemplary fuse 300 is illustrated. The fuse 300 is exemplary of the type of fuse that can be used in the crack detectors described herein. The fuse 300 includes a first electrode 302, a second electrode 304, and a fusible link 306. In general, the fuse 300 is implemented to be electrically opened—e.g., opened by the application of current or voltage above a threshold amount. When opened the ohmic connection between electrodes 302 and 304 is severed, creating a high impedance between electrodes 302 and 304. This high impedance state effectively electrically uncouples the electrodes 302 and 304. In the die crack detectors described this electrically uncouples the package lead from the conductive trace (not shown in FIG. 3).

As one example, the fuse 300 can be implemented with metal in the first electrode 302 and the second electrode 304, and with polysilicon in the fusible link 306. For example, the polysilicon can comprise a 1.5×2.5 µm section of polysilicon. In an example of such an embodiment the fuse 300 could be opened with the application of at least 75 mA of current for 150 microseconds. In such the fuse 300 would initially have a resistance of between 20 and 40 ohms, and after opening have a resistance of between 1E12 and 270E12 ohms. In another example, the fuse 300 can be implemented with metal in the first electrode 302 and the second electrode 304, and with cobolt silicide in the fusible link 306. For example, the polysilicon can comprise a 1×2.7 µm section of CoSi. Again, these are just some examples of the type of fuse that can be used.

As another example, the fuse 300 can comprise a metal silicide fuse. U.S. Pat. No. 7,575,958 describes a specific example of such a fuse that can be integrated on the die 110. In this example the fuse is implemented using a layer of silicon germanium (SiGe) that provides a thermal insulation to contain heat during programming. Of course, this is just one example, and other implementations of fuses are also possible. For example, a variety of fuses implemented with tungsten can be used.

Figure 4:
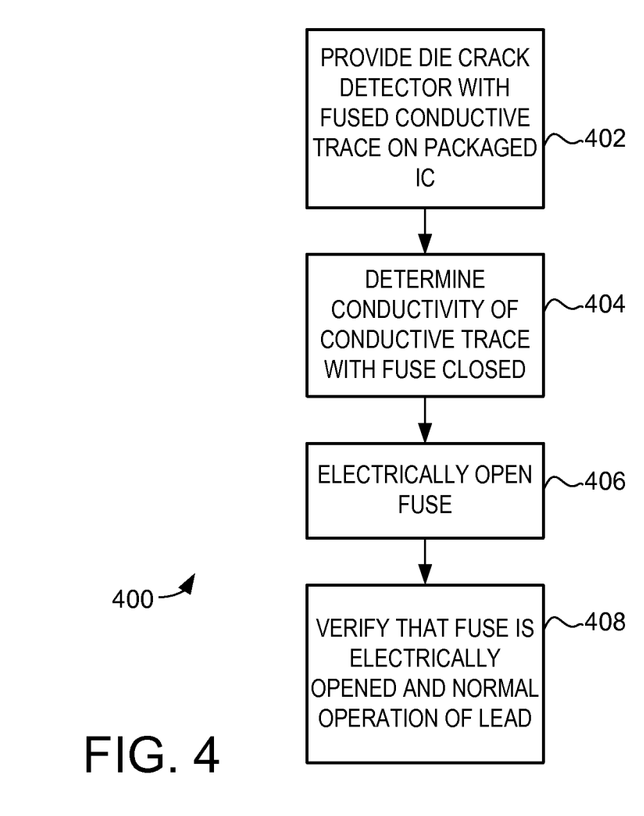
FIG. 4 is a flow diagram of a die crack detection method in accordance with another example embodiment.

Turning now to FIG. 4, a method 400 for detecting cracks on a die is illustrated. The step 402 is to provide a die crack detector with a fused conductive trace on a packaged IC. As described above, the die crack detector uses a conductive trace (e.g., conductive trace 102) that is arranged to at least substantially extend around a perimeter of an integrated circuit die (e.g., die 110). A fuse (e.g., fuse 104) is coupled in series with the conductive trace, and a package lead (e.g., package lead 106) is electrically coupled to both the fuse and another operational element on the integrated circuit die. The conductive trace, fuse and package lead are arranged such that the package lead is electrically coupled to the conductive trace when the fuse is intact.

The step 404 is to determine the conductivity of the conductive trace with the fuse closed. In performing step 404 any suitable technique can be used to determine the conductivity of the conductive trace. For example, applying a known voltage to the package lead and measuring the resulting current. However, to avoid inadvertently opening the fuse such voltage should be selected to ensure that the resulting current will be less threshold amount to open the fuse.

It should be noted that to determine the conductivity of the conductive trace it is not required that the actual value of conductivity be calculated. Instead, the step 404 could be performed by simply determining if the conductivity is above a threshold amount. For example, by determining if the current resulting from an applied voltage rises above a specified threshold. In this case the measure of conductivity is simple a determination of continuity in the conductive trace.

The step 406 is to electrically open the fuse. As described above, the fuse can be opened by applying a voltage and/or current above a specified threshold. The step 408 is to verify that the fuse is electrically opened and the lead now operates normally. After the fuse has been opened the package lead is no longer coupled to the conductive trace, but remains coupled to the other operational element on the packaged die. For this reason the package lead can then be used for normal operation of the device on the packaged die without the conductive trace interfering with this operation. In step 408 the electric opening of the fuse can be verified by applying suitable voltage to the lead and determining if current still flows. Of course, other techniques may also be used.

Again, it should be noted that because the same package lead is used in die crack detection and the later normal operation of the device that the need for a separate, dedicated lead for die crack detection on the package can be avoided.

The embodiments described herein thus provide a die crack detector and method that use a conductive trace arranged to at least substantially extend around a perimeter of an integrated circuit die. A fuse is coupled in series with the conductive trace, and a package lead is electrically coupled to both the fuse and another operational element on the integrated circuit die. With the fuse intact the package lead can thus be used to determine a measurement of the conductivity of the conductive trace, with the measurement of conductivity indicative of the presence of a crack on the die. After such testing the fuse can be electrically opened, and the package lead used for normal operation of the device on the packaged die without the conductive trace interfering with this operation.

In one embodiment, a die crack detector is provided that comprises: a conductive trace arranged to at least substantially extend around a perimeter of an integrated circuit die; a one-time programmable element coupled in series with the conductive trace; and a lead electrically coupled to the fuse and a other operational element on the integrated circuit die, wherein the conductive trace is ohmically coupled to the lead for die crack detection when the one-time programmable element is closed, and wherein the conductive trace is not ohmically coupled to the lead when the one-time programmable element has been electrically opened.

In another embodiment, a device is provided that comprises: an integrated circuit die having a perimeter, the integrated circuit die further including: a first operational element; a conductive trace arranged to substantially extend around the perimeter of the integrated circuit die, the conductive trace having a first end and a second end, the second end coupled to ground; a fuse coupled in series with the first end of the conductive trace; and a package enclosing the integrated circuit die, the package including a plurality of leads, with a first of the plurality of leads electrically coupled to the fuse and the first operational element, wherein the conductive trace is ohmically coupled to the first of the plurality of leads for die crack detection when the fuse is closed, and wherein the conductive trace is not ohmically coupled to the first of the plurality of leads when the fuse has been electrically opened.

In another embodiment a method is provided that comprises: forming a first operational element on an integrated circuit die portion of a semiconductor substrate; forming a conductive trace arranged to substantially extend around a perimeter of the integrated circuit die portion, the conductive trace having a first end and a second end, the second end coupled to ground; forming a fuse coupled in series with the first end of the conductive trace on the integrated circuit die portion; packaging the integrated circuit die portion in a package, the package enclosing the integrated circuit die portion, the package including a plurality of leads, with a first of the plurality of leads electrically coupled to the fuse and the first operational element, wherein the conductive trace is ohmically coupled to the first of the plurality of leads for die crack detection when the fuse is closed; testing the packaged integrated circuit die portion for cracks by measuring conductivity between the first of the plurality of leads and ground; and electrically opening the fuse to make the conductive trace not ohmically coupled to the first of the plurality of leads after the testing.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminologies may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A die crack detector, the die crack detector comprising:
   a conductive trace arranged to at least substantially extend around a perimeter of an integrated circuit die;
   a one-time programmable element coupled in series with the conductive trace; and
   a lead electrically coupled to the one-time programmable element and another operational element on the integrated circuit die, wherein the conductive trace is ohmically coupled to the lead for die crack detection when the one-time programmable element is closed, and wherein the conductive trace is not ohmically coupled to the lead when the one-time programmable element has been electrically opened.

2. The die crack detector of claim 1 wherein the one-time programmable element comprises a fuse.

3. The die crack detector of claim 2 wherein the conductive trace includes a first end and a second end, and wherein the first end is coupled to the fuse and the second end is coupled to a ground.

4. The die crack detector of claim 2 wherein the fuse is configured to be electrically opened by application of electric current above a threshold.

5. The die crack detector of claim 2 wherein the fuse comprises metal silicide.

6. The die crack detector of claim 1 wherein the conductive trace is formed of a conductive layer material on the integrated circuit die.

7. The die crack detector of claim 1 wherein the conductive trace is formed of interconnect layer material on the integrated circuit die.

8. The die crack detector of claim 1 wherein the other operational element comprises an integrated passive device.

9. The die crack detector of claim 8 wherein the integrated passive device comprises a capacitor, and wherein the lead is electrically coupled to a first electrode of the capacitor.

10. The die crack detector of claim 1 wherein the other operational element comprises a two terminal device with a first terminal connected to ground and a second terminal connected to the lead.

11. The die crack detector of claim 1 wherein the conductive trace is proximate a die seal ring structure on the integrated circuit die.

12. The die crack detector of claim 11 wherein the conductive trace is arranged inside the die seal ring structure.

13. A device comprising:
    an integrated circuit die having a perimeter, the integrated circuit die further including:
    a first operational element;
    a conductive trace arranged to substantially extend around the perimeter of the integrated circuit die, the conductive trace having a first end and a second end, the second end coupled to a ground;
    a fuse coupled in series with the first end of the conductive trace; and
    a package enclosing the integrated circuit die, the package including a plurality of leads, with a first of the plurality of leads is electrically coupled to the fuse and the first operational element, wherein the conductive trace is ohmically coupled to the first of the plurality of leads for die crack detection when the fuse is closed, and wherein the conductive trace is not ohmically coupled to the first of the plurality of leads when the fuse has been electrically opened.

14. The device of claim 13 wherein the conductive trace is formed of interconnect layer material.

15. The device of claim 13 wherein the fuse is configured to be electrically opened by application of electric current above a threshold.

16. The device of claim 13 wherein the first operational element comprises an integrated passive device.

17. The device of claim 13 wherein the conductive trace is proximate a die seal ring structure on the integrated circuit die.

* * * * *